(12) United States Patent
Nedivi

(10) Patent No.: US 7,317,522 B2
(45) Date of Patent: Jan. 8, 2008

(54) VERIFICATION OF NON-RECURRING DEFECTS IN PATTERN INSPECTION

(75) Inventor: Jacob Nedivi, Alfe Menashe (IL)

(73) Assignee: Orbotech, Ltd., Yavne (IL)

( * ) Notice: Subject to any disclaimer, the term of this patent is extended or adjusted under 35 U.S.C. 154(b) by 179 days.

(21) Appl. No.: 11/072,235

(22) Filed: Mar. 7, 2005

(65) Prior Publication Data

US 2005/0196032 A1 Sep. 8, 2005

Related U.S. Application Data

(60) Provisional application No. 60/550,061, filed on Mar. 5, 2004.

(51) Int. Cl.
*G01N 21/00* (2006.01)
(52) U.S. Cl. .................... 356/237.5; 382/145; 382/147
(58) Field of Classification Search ............. 356/237.1, 356/2, 3, 4, 5, 237; 382/141, 145, 147, 148, 382/149, 150
See application file for complete search history.

(56) References Cited

U.S. PATENT DOCUMENTS

| | | | | | |
|---|---|---|---|---|---|
| 4,247,203 | A | * | 1/1981 | Levy et al. ................. | 356/398 |
| 4,628,531 | A | * | 12/1986 | Okamoto et al. ........... | 382/144 |
| 5,204,912 | A | * | 4/1993 | Schimanski ................ | 382/147 |
| 5,369,431 | A | * | 11/1994 | Levy et al. ................. | 348/126 |
| 5,699,447 | A | * | 12/1997 | Alumot et al. .............. | 382/145 |
| 6,366,690 | B1 | * | 4/2002 | Smilansky et al. ......... | 382/149 |
| 6,975,754 | B2 | * | 12/2005 | Hiroi et al. ................. | 382/149 |
| 2002/0114506 | A1 | * | 8/2002 | Hiroi et al. ................. | 382/149 |
| 2003/0020905 | A1 | * | 1/2003 | Savareigo et al. ....... | 356/237.5 |

OTHER PUBLICATIONS

Brochure, InFinex™ 3000 Series:, Orbotech Ltd., Yavne, Israel, Aug. 2004, 4 pages.
Brochure, InSpire—9000™ Automated Optical Inspection System, Orbotech Ltd., Yavne, Israel, Feb. 1995, 5 pages.
Brochure, Spiron—8800 AVIP™, AOI with Automatic Verification-In-Parallel, Orbotech Ltd., Yavne, Israel, Jul. 2004, 4 pages.
Brochure, Vision—300AP™ AOI Series, Orbotech Ltd., Yavne, Israel, Apr. 2002, 4 pages.
Brochure, Discovery™ 6 AOI System, Orbotech Ltd., Yavne, Israel, Sep. 2004, 4 pages.
Brochure, VRS-5™ Series, Orbotech Ltd., Yavne, Israel, Feb. 2003, 2 pages.

* cited by examiner

*Primary Examiner*—Tarifur Chowdhury
*Assistant Examiner*—Jonathan M Hansen
(74) *Attorney, Agent, or Firm*—Sughrue Mion, PLLC

(57) ABSTRACT

A system and method for verifying defects in electrical circuit patterns including supplying a plurality of like electrical circuit patterns to a defect verification assembly after identification of candidate defects at an automated inspection assembly; verifying selected candidate defects as being one of: an actual defect, other than an actual defect; and marking a candidate defect in response to a recurrence of a given candidate defect at substantially corresponding locations on at least two electrical circuit patterns.

24 Claims, 4 Drawing Sheets

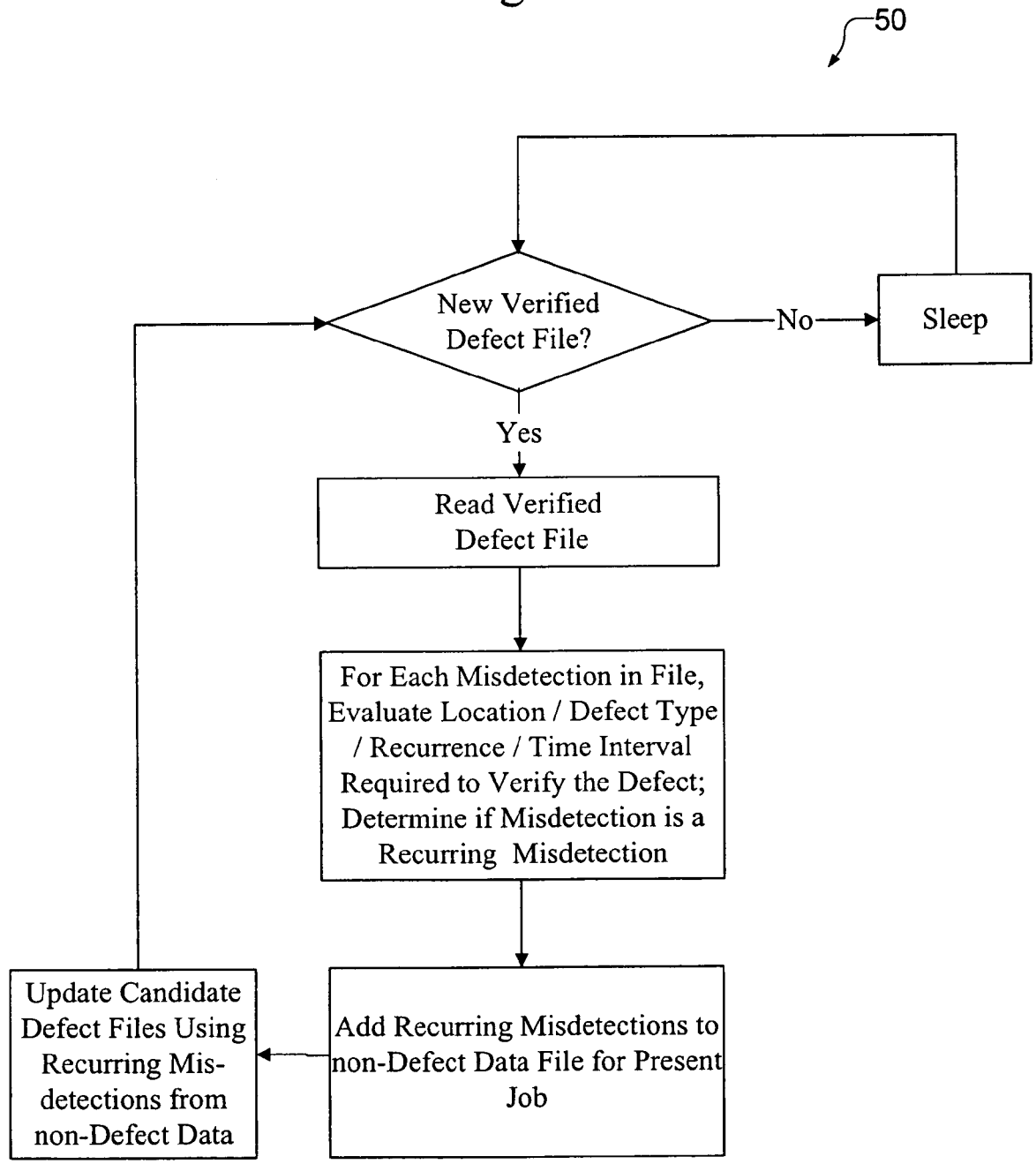

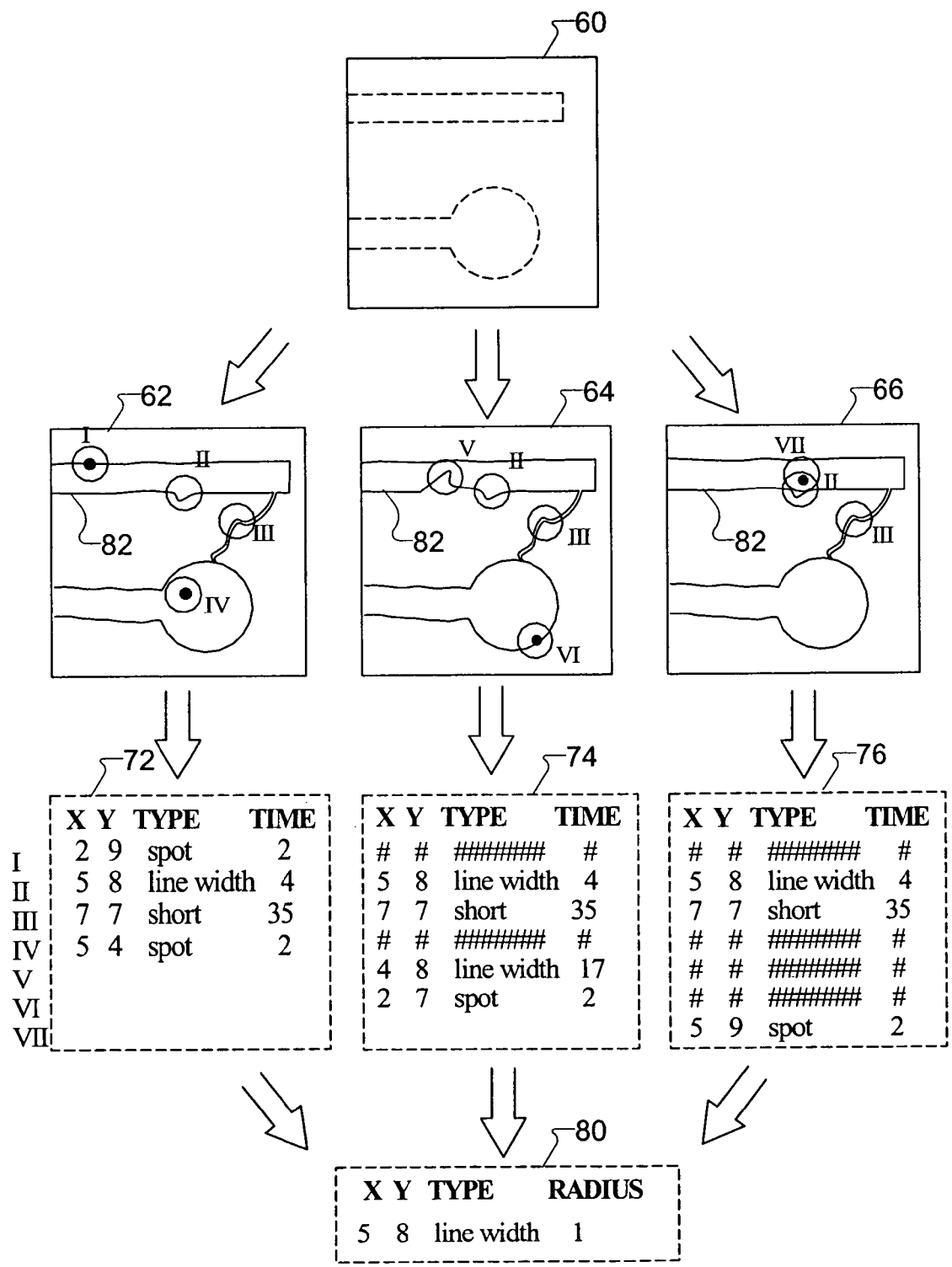

VERIFICATION OF NON-RECURRING DEFECTS IN PATTERN INSPECTION

This application claims the benefit of U.S. Provisional Patent Application No. 60/550,061, entitled "Verification of non-Recurring Defects in Pattern Inspection" filed on Mar. 5, 2004, the disclosure of which is incorporated by reference in its entirety.

FIELD OF THE INVENTION

The present invention relates to systems and methods for the automated optical inspection of patterns such as electrical circuits, and more particularly to systems and methods for reducing the quantity of candidate defects detected during inspection.

BACKGROUND OF THE INVENTION

The fabrication of electrical circuits, such as printed circuit boards, interconnect devices and flat panel displays, typically includes an automated optical inspection operation. Automated optical inspection typically identifies a collection of candidate defects, including both actual defects and false defects. Following automated optical inspection, a panel containing electrical circuit patterns is supplied to a verification station whereat candidate defects are evaluated and then identified as being either a actual defect or a false defect. Where possible, actual defects are repaired.

False defects include, for example, both random false defects and recurring false defects. Random false defects include, for example, dust and oxidation. Recurring false defects include, for example, geometric pattern anomalies that are repeated throughout a batch of patterns to be inspected. Although the recurring false defects deviate from an ideal pattern to be detected as a defect, they are not sufficiently deviant to be categorized as an actual defect requiring subsequent repair.

Many candidate defects are quickly categorized during manual defect verification as false defects, for example geometric deviations in shape. Other candidate defects require additional time during manual verification in order to determine whether they are a random defect or a recurring defect. Some random defects, for example short circuits, require even more additional time to effect repair of the defect.

SUMMARY OF INVENTION

The present invention seeks to provide an improved methodology for verifying candidate defects in patterns, for example patterns comprising portions of electrical circuits disposed on a substrate panel.

A general aspect of the present invention relates to systems and methods for evaluating candidate defects that avoid evaluating recurring false defects during a defect verification operation.

Another general aspect of the present invention relates to at least one of recording a location of a false defect and recording a time interval for evaluating a candidate defect. The recorded information is utilized during the verification of candidate defects on subsequent patterns to avoid unnecessary evaluation of recurring false defects.

Another general aspect of the present invention relates to a methodology for fabricating electrical circuits in which a portion of an electrical circuit is formed on a substrate and the substrate is automatically optically inspected. Candidate defects are evaluated as to whether they are an actual defect or a false defect. The evaluation operation avoids evaluating those false defects that recur in a plurality of electrical circuit substrates.

In accordance with an embodiment of the present invention there is thus provided a method for verifying defects in electrical circuit patterns including supplying a plurality of like electrical circuit patterns to a defect verification assembly after inspection of the electrical circuit patterns at an automated inspection assembly to detect candidate defects; indicating locations of candidate defect; and evaluating at least some indicated locations at the defect verification assembly to determine whether a candidate defect is an actual defect; and avoiding evaluating at least one recurring false defect. This methodology is employed as part of an inspection operation during the fabrication of printed circuit boards and other electrical circuits.

In accordance with another embodiment of the present invention there is thus provided a system for inspecting electrical circuit for defects including at least one automated inspection facility operative to automatically inspect electrical circuit substrates for defects and to indicate locations of candidate defects thereon; a recurring defect marker operative to receive indications of candidate defects for a plurality of electrical circuits, and to mark candidate defect locations that recur in a plurality of electrical circuits; and at least one verification facility receiving said indications of candidate defect not marked as being a recurring candidate defect.

BRIEF DESCRIPTION OF DRAWINGS

The present invention will be understood and appreciated more fully from the following detailed description, taken in conjunction with the drawings in which:

FIG. 3 is a simplified flow diagram of a methodology for generating a false defect mask employed in the methodology seen in FIG. 2; and FIG. 4 is a simplified pictorial diagram illustrating operation of the methodology seen in FIG. 2.

DETAILED DESCRIPTION OF PREFERRED EMBODIMENTS

Figure 1:
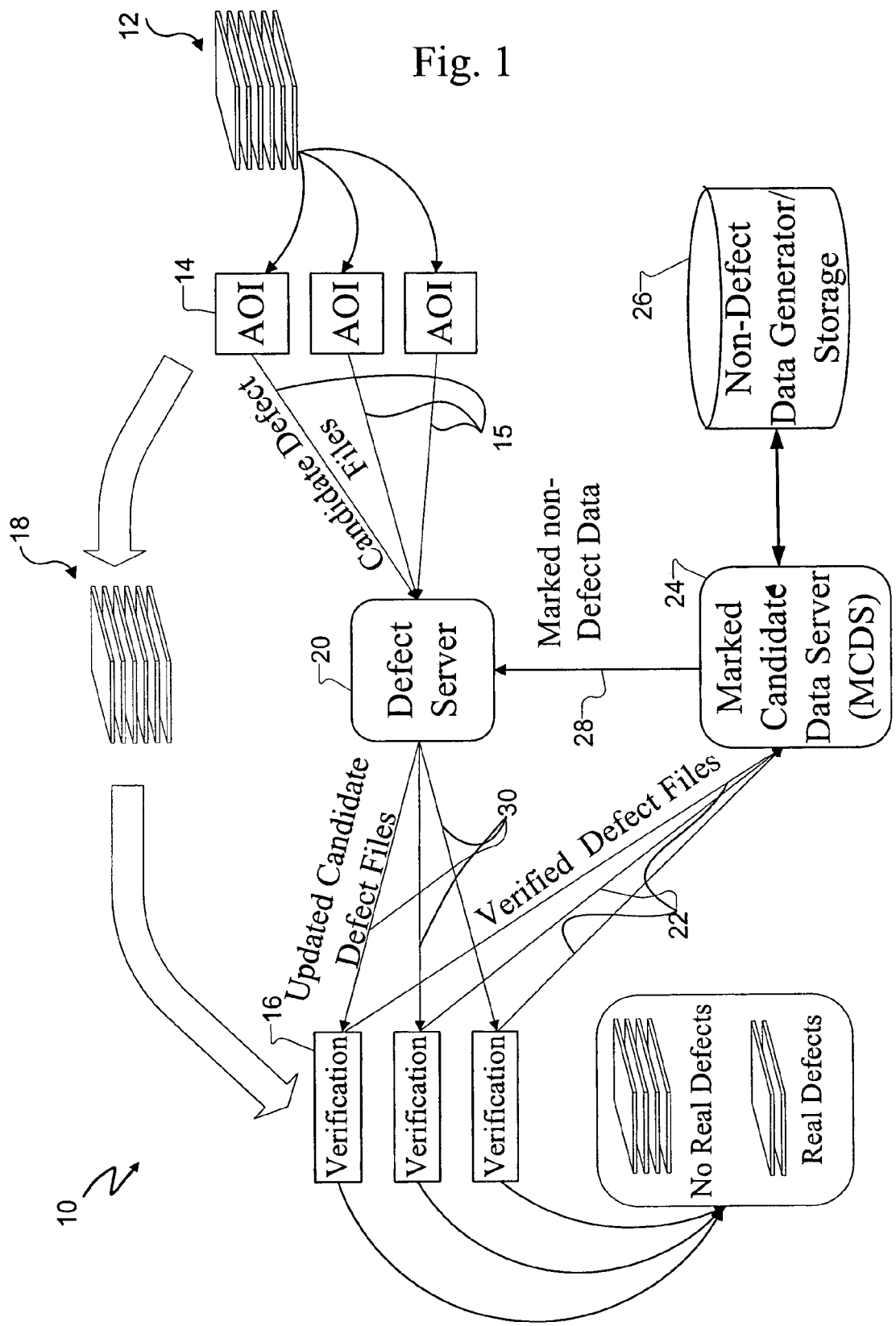
FIG. 1 is a simplified block diagram illustrating a system for inspecting electrical circuit substrates for defects in accordance with an embodiment of the present invention.

Reference is made to FIG. 1, which is a simplified block diagram illustrating a system 10 for inspecting electrical circuit substrates 12 for defects, in accordance with an embodiment of the present invention. System 10 includes at least one automated inspection facility having, for example, at least one automated optical inspection (AOI) system 14, and a verification facility 16 having at least one verification station. A verification facility may include, for example, at least one of a manually operated verification station and a verification station with an automatic verification functionality. Electrical circuit substrates 12 include, for example, metallic members deposited on a substrate surface using any suitable electrical circuit fabrication process. As used herein, the term electrical circuit refers to any suitable electrical circuit, or portion of an electrical circuit, including, without limitation, printed circuit boards, ball grid array substrates, multi-chip modules, integrated circuits, flat panel displays and other suitable patterned substrates.

AOI 14 is operative, for example during electrical circuit fabrication, to acquire images of electrical circuit substrates 12 and to inspect the images to identify candidate defects in an electrical circuit pattern deposited, for example, on a surface thereof. For each electrical circuit inspected, a candidate defect file 15 indicating respective locations of candidate defects on substrates 12 is output by an AOI systems 14. Candidate defect files 15 typically indicate both actual defects and defects which in actuality are misdetections, namely a non-defect incorrectly determined to be a defect.

A verification station 16 receives an AOI inspected electrical circuit 18 along with a corresponding candidate defect file. The verification station 16 provides a defect verification functionality in which candidate defects are evaluated and verified, for example as being either an actual defect or a misdetection.

In FIG. 1, it is seen that system 10 includes several AOI systems 14 and several verification stations 16, all handling inspection and defect verification for a plurality of in-fabrication electrical circuit substrates 12. Candidate defect files 15 are passed to verification station 16 through a defect server 20, which is operative to correlate between a given electrical circuit substrate 12 and its corresponding candidate defect file 15. It is noted, however, that system 10 may include as few as one AOI 14 passing candidate defect files 15 directly to one verification station 16, in which case a defect server 20 would be obviated.

In general, the functionality of AOI systems is well known and several suitable AOI systems are readily commercially available. Suitable AOI systems include, for example without limitation, the InFinex™, Inspire™, Spiron™, V-300™, and DISCOVERY™ AOI systems all of which are available from Orbotech Ltd. of Yavne, Israel.

The functionality of defect verification systems is also well known and suitable systems are also readily commercially available. Suitable verification facilities include, for example, the VRS™ family of verification stations commercially available from Orbotech Ltd. of Yavne, Israel. In accordance with an embodiment of the invention, a defect verification facility 16 includes a microscope and an automatically movable stage. The stage automatically places locations of candidate defect on a substrate beneath the microscope for defect verification by a human operator. Verification systems employing automatic, that is computerized without human intervention, defect verification may also be employed alone, or in addition to human operator based verification. A suitable automatic verification station is described in U.S. patent application Ser. No. 10/793,224, entitled, "System and Method for Inspecting Electrical Circuits Utilizing Reflective and Fluorescent Imagery", filed Mar. 5, 2004, the disclosure of which is incorporated herein in its entirety, assigned to Orbotech Ltd., of Yavne, Israel.

In accordance with an embodiment of the present invention, candidate defect files 15 are updated prior to verification to mark least some defects as having a high probability of correspondence to a recurring misdetection. Thus, for example, recurring non-random candidate defects meeting a predetermined criteria classifying them as being misdetections, are suitably marked. Verification is not performed on candidate defects suitably marked as corresponding to a recurring misdetection. Marking may be actually marking candidate defects where further verification is not to be performed. Alternatively marking may be marking candidate defects where further verification is to be performed, and not marking those candidate defects where further verification is to be avoided.

There are several measures by which a given candidate defect can be identified as a recurring misdetection. Suitable measures include, for example, at least one of the combination of a location of the candidate defect among substrates in a batch of substrates to be inspected, for example to ensure that the defect is not random, a time interval that is required to evaluate whether a given defect is real or false (typically actual defects require a longer time interval because they are also repaired, an operation that requires time), and a type of defect. In accordance with an embodiment of the invention, a type of defect is supplied by AOI 14.

In system 10 illustrated in FIG. 1, a verification result, generated at verification stations 16 as part of a defect verification file 22, is supplied to a marked candidate defect server (MCDS) 24. MCDS 24 is in communication with a marker data generator 26 operative to generate, and optionally store, a marked non-defect data file 28 containing marked candidate defects. In an embodiment of the invention, a recurring defect is a defect that meets at least one of several criteria, for example, a type of defect, a location of similar defect on several electrical circuit substrates 12, and a time interval required to evaluate the defect at a verification station 16.

In accordance with an embodiment of the invention, a marked non-defect data file 28 is employed to update candidate defect files 15 to generate updated candidate defect files 30. Updated candidate defect files 30 include, for example, all candidate defects output by an AOI system 14 with respect to a given electrical circuit 12, but in which recurring false defects are marked so that they are skipped at verification stations 16. The remaining candidate defects on inspected electrical circuits 18 are verified at verification facilities 16 using the updated candidate defect files 30, thereby saving time that would otherwise be necessary to verify recurring misdetections.

Figure 2:
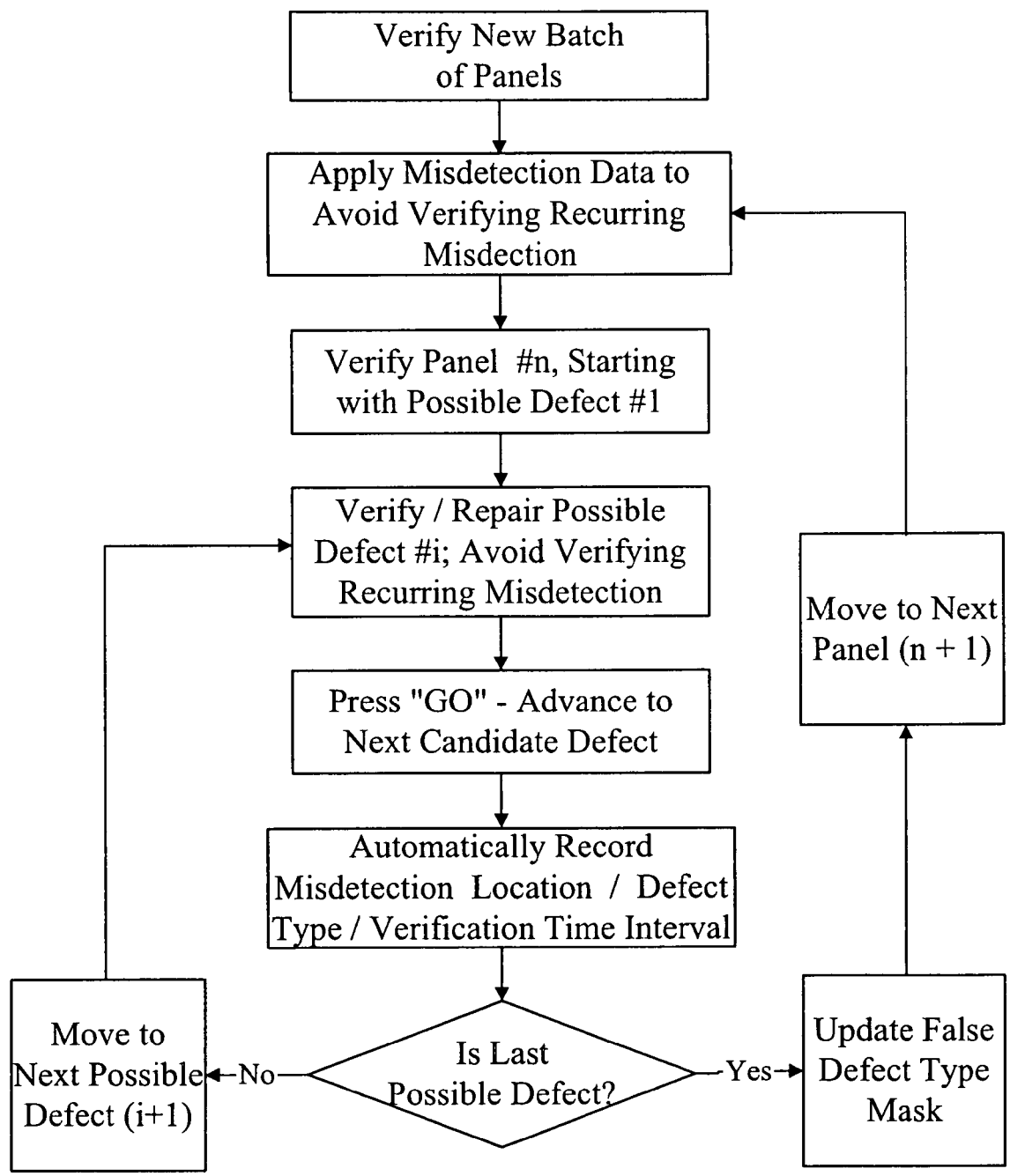
FIG. 2 is a simplified flow diagram of a methodology for verifying defects in accordance with an embodiment of the present invention.

Reference is now made to FIG. 2 which is a simplified flow diagram of a methodology 40 for verifying defects in accordance with an embodiment of the present invention. The methodology of FIG. 2 is implemented, for example, on system 10 of FIG. 1.

Methodology 40 is in effect a learning system in which the locations of some candidate defects, for example recurring false defects, are learned during the inspection of a batch of successive electrical circuits 12. Whenever a new recurring defect is identified, the marked non-defect data file 28 is updated. This data file is then used to update candidate defect files from subsequently inspected electrical circuits 12, to avoid performing a verification operation on a marked type of misdetection at a marked location on subsequently inspected electrical circuits.

Methodology 40 commences with the verification of candidate defects on a new batch of panels, or substrates. The verification of a batch of substrates typically takes place after all of the substrates in a batch of substrates have been inspected by AOI systems 14. Optionally, verification may start prior to the completion of an automated inspection operation on all of the substrates in a batch.

Prior to the defect verification of a substrate, recurring misdetection data is employed to revise candidate defect files to avoid verifying certain types of misdetections. The recurring misdetection data is used, for example, to mark candidate defect location for which candidate defects on previously inspected electrical circuits have at least one of the following characteristics: the candidate defect is of a predetermined type, is at a predetermined location, has been verified as a non defect in less than a threshold time interval. A suitable combination of characteristics is known ahead of time, to a high degree of certainty, as being indicative of misdetection by an AOl system. The marking of certain candidate defects saves time and verification resources by avoiding verifying defects which are known in advance to be misdetections. The remaining candidate defects are verified on a first panel, typically one at a time in sequence. In accordance with an embodiment of the invention, verification proceeds while avoiding recurring false defects.

The verification of defects on a substrate proceeds in a looped sequence. Each actual defect that is found on a substrate is repaired, if repairable. It is noted that some types of false defects, for example recurring misdetections, are avoided entirely such that they are skipped and not evaluated.

Upon completion of the evaluation of a defect, a verification operator signals to advance to the next defect to be evaluated, for example by pressing a "go" button. In accordance with an embodiment of the invention, at the time of signaling the system to advance to evaluate the next location whereat a candidate defect is located, the time interval required to evaluate the defect as being an actual defect or misdetection is recorded. This can be done automatically using, for example, an internal system timer. The type of defect, for example provided by the AOI system inspecting the defect, may also be recorded.

Evaluation of candidate defects on a panel progresses by looping back to verification of a next candidate defect until the last candidate defect on a panel is evaluated and verified. Once all of the candidate defects in an updated candidate defect file have been evaluated and verified, for example as being an actual defect or misdetection, and if possible repaired, the defect type mask is updated with any new defects that are to be avoided in subsequently verified substrates. At the beginning of a batch, it is likely for there to be a larger quantity of misdetections that are evaluated. As verification progresses through a batch, new misdetections, such as candidate defects which to a high degree of certainty are recurring misdetections, are added to the non-defect data file and their verification is avoided in subsequent verification.

Reference is now made to FIG. 3 is a simplified flow diagram of a methodology for generating a false defect mask 50 employed in the methodology 40 of FIG. 2, in accordance with an embodiment of the invention. Methodology 50 of FIG. 3 relates to generating a defect mask for filtering out recurring misdetections. In accordance with an embodiment of the invention employing methodology 50, a recurring misdetections is a candidate defect that recurs at the same location on different electrical circuit substrates 12. In accordance with an embodiment of the invention, a recurring false alarm defect is characterized by a recurring defect having at least one of: a recurring location and a recurring time interval for inspection which does not exceed a maximum threshold time interval. Optionally, the defect may also be characterized by type.

Methodology 50 seen in FIG. 3 commences with evaluating a new verified defect file 22, for example supplied by a verification facility 16 (FIG. 1). If the verification file is new, it is read. Then for each candidate defect which was verified as being a non-defect, that is to say a false alarm defect, its location, defect type, time interval for verification, and whether it recurred on a parameterized number of previous substrates 12 are all considered. For example, if a given type of candidate defect, for example any defect which is not merely a spec of dust, is found to be a misdetection that recurs at generally the same location on at least n substrate panels (where n is a parameterized number of substrates, for example 3 substrates), then it is deemed to be a recurring misdetection. In accordance with an embodiment of the invention, further criteria may be added, for example that the time interval for evaluating the defect did not exceed a maximum evaluation time interval.

It is noted that the repair of a real defect typically requires at least a minimum time interval which is much longer than the time interval required merely to evaluate a candidate defect and dismiss it as being a misdetection. Thus, the additional requirement that the actual evaluation time interval needs to be less than a given evaluation time interval further ensures that a recurring defect is indeed a misdetection that does not require repair.

Newly identified recurring misdetections are added to a non-defect data file for the present job or batch. Candidate defect files coming from the AOI 14 (FIG. 1) are updated using non-defect data to ensure that recurring misdetections are not considered during defect verification of subsequent electrical circuit substrates.

Reference is now made to FIG. 4, which is a simplified pictorial diagram illustrating operation of the methodology seen in FIG. 2. An image reference 60 and several acquired images 62, 64 and 66 are depicted. Reference 60 depicts a reference pattern, for example a portion of an electrical circuit, supplied for example by a CAM reference generator such as is available from Frontline Solutions of Yavne, Israel. Each of the acquired images represents an actual pattern, such as an electrical circuit, to be inspected. The acquired images 62, 64 and 66 are acquired, for example, using a suitable AOI system 14 (FIG. 1) and are then evaluated using reference 60, using for example any commercially available AOI system, in order to ascertain the presence of candidate defects. Candidate defects are indicated in FIG. 4 by roman numerals I-VII.

A candidate defect file 72, 74 and 76 is associated with each a corresponding acquired images 62, 64 and 66 respectively. Each of the defect files 72, 74 and 76 includes several information fields characterizing a defect: an X coordinate of a defect location, a Y coordinate of a defect location, a type of defect at the location and a time required to evaluate the defect. It is noted that the data structure of candidate defect files 72, 74 and 76 and the recurring defect mask 80 may be any suitable data structure for use in association with pattern inspection and verification systems, and the data structure show is merely exemplary. The file structure of the defect file seen in FIG. 4 is highly simplified for the purposes clarity and to facilitate teaching of the invention.

A recurring defect mask 80 is generated from an evaluation of candidate defect files 72, 74 and 76. The recurring defect mask is applied to filter out recurring defects during the defect verification of defects on subsequently inspected electrical circuits, as described with reference to FIGS. 1 and 2. A recurring non-defect data file 80 includes several information fields characterizing a recurring misdetection to be masked: an X coordinate of a defect location, a Y coordinate of a defect location, a type of defect at the location and an acceptable radius covering an area in which defects of the same (or similar) type will not be considered in defect verification to be performed on subsequently inspected electrical circuits. It is noted that the data structure of recurring defect mask 80 may be any suitable data structure for use in association with pattern inspection and verification systems. The file structure of the recurring defect mask seen in FIG. 4 is highly simplified for the purposes clarity and to facilitate teaching of the invention.

Four candidate defects I, II, III and IV are seen in candidate defect file 72, associated with acquired image 62. Four candidate defects II, III, V and VI are seen in candidate defect file 74, associated with acquired image 64. Three candidate defects II, III and VII are seen in candidate defect file 76, associated with acquired image 66.

Candidate defects I, IV, VI and VII are each characterized, for example by AOI 14 in FIG. 1, as "spot" defects. A spot defect could be for example dust. During a defect verification operation each of the candidate defects I, IV, VI and VII occur in each of images 62, 64 and 66 at a different location. Each candidate defects I, IV, VI and VII required 2 seconds to evaluate and determine that it is a misdetection. Because the candidate defects I, IV, VI are randomly located and non-repeating, these defects are not included in recurring defect mask 80.

Candidate defect II is characterized in FIG. 1 as a "line width" defect which in each of acquired images 62, 64 and 66 requires 4 seconds to verify. Although candidate defect II deviates from the reference sufficiently to be marked as a candidate defect, the difference, which is a relatively small change in width of a conductor 82, would not cause an impediment to functioning of the electrical circuit and typically would not require repair. Candidate defect II is therefore considered a misdetection. Furthermore, because candidate defect II recurs at the same location in each of acquired images 62, 64 and 66, and because the time required to evaluate the defect is less than a given time threshold, candidate defect II is characterized as a recurring defect and is included in recurring defect mask 80.

Candidate defect III is characterized in FIG. 1 as a "short defect" which appears in each of acquired images 62, 64 and 66. Candidate defect requires 35 seconds to verify. The relatively lengthy time interval for verifying candidate defect II results because typically candidate defect III is repaired, for example by removing the excess conductor with a scalpel. Although candidate defect III recurs at the same location in each of acquired images 62, 64 and 66, because the time required to evaluate and repair the defect exceeds a threshold time interval, candidate defect III is an actual defect that is not included in recurring defect mask 80.

Candidate defect V is characterized in FIG. 4 as a line width defect which appears only in acquired images 64. Candidate defect requires 17 seconds to verify. The relatively lengthy time interval for verifying candidate defect II results because a decision needs to be made whether the defect would indeed impair functioning of the electrical circuit. Although, no attempt may be made to repair candidate defect V, it would not be included in recurring defect mask 80 because the candidate defect occurs only in acquired image 64, and does not recur elsewhere at the same location.

It is appreciated by persons skilled in the art that the present invention is not limited by what has been particularly shown and described hereinabove. Rather the present invention includes modifications and variations thereof which would occur to a person of skill in the art upon reading the foregoing description and which are not in the prior art.

The invention claimed is:

1. A method for verifying defects in electrical circuit patterns, comprising:
   supplying a plurality of like electrical circuit patterns to a defect verification assembly after identification of candidate defects at an automated inspection assembly;
   verifying selected candidate defects as being one of: an actual defect, and a false defect;
   marking a candidate defect in response to a recurrence of a given candidate defect at substantially corresponding locations on at least two electrical circuit patterns; and
   applying candidate defect markings from previously verified electrical circuit patterns to a currently verified electrical circuit pattern, and wherein said verifying comprises avoiding verifying at least some marked candidate defects.

2. The method claimed in claim 1, wherein said false defect comprises one or more of a misdetection and a non-defect.

3. The method claimed in claim 1, further comprising repairing a repairable actual defect.

4. The method claimed in claim 1, further comprising discarding an electrical circuit pattern comprising a non-repairable actual defect.

5. The method claimed in claim 1, wherein said marking is further in response to a defect type parameter.

6. A method for verifying defects in electrical circuit patterns, comprising:
   supplying a plurality of like electrical circuit patterns to a defect verification assembly after identification of candidate defects at an automated inspection assembly;
   verifying selected candidate defects as being one of: an actual defect, and a false defect;
   marking a candidate defect in response to a recurrence of a given candidate defect at substantially corresponding locations on at least two electrical circuit patterns and
   applying candidate defect markings from previously verified electrical circuit patterns to a currently verified electrical circuit pattern, wherein said verifying comprises avoiding verifying at least some marked candidate defects, and wherein said marking is further in response to a verification time interval parameter.

7. The method claimed in claim 6, wherein said verification time interval parameter comprises verifying a candidate defect in less than said predetermined time interval.

8. The method claimed in claim 6, wherein said operation is further in response to a defect type parameter.

9. A defect verification system for verifying defects in electrical circuit patterns, comprising:
   a defect verification assembly receiving a plurality of like electrical circuit patterns after identification of candidate defects at an automated inspection assembly, whereat selected candidate defects are verified as being one of: an actual defect, and a false defect; and
   a candidate defect marker marking candidate defects at least partially in response to a recurrence of a given candidate defect at substantially corresponding locations on at least two electrical circuit patterns,
   wherein said defect verification assembly is operative to apply candidate defect markings from previously verified electrical circuit patterns to a currently verified electrical circuit pattern, and wherein said defect verification assembly is operative to avoid verifying at least some marked candidate defects.

10. The defect verification system claimed in claim 9, wherein said false defect comprises one or more of a misdetection and a non-defect.

11. The defect verification system claimed in claim 9, wherein said defect verification assembly comprises a repair station for repairing repairable actual defects.

12. The defect verification system claimed in claim 9, wherein said candidate defect marker is operative in further response to a defect type parameter.

13. A defect verification system for verifying defects in electrical circuit patterns, comprising:
- a defect verification assembly receiving a plurality of like electrical circuit patterns after identification of candidate defects at an automated inspection assembly, whereat selected candidate defects are verified as being one of: an actual defect, and a false defect; and
- a candidate defect marker marking candidate defects at least partially in response to a recurrence of a given candidate defect at substantially corresponding locations on at least two electrical circuit patterns,
- wherein said defect verification assembly is operative to apply candidate defect markings from previously verified electrical circuit patterns to a currently verified electrical circuit pattern, and wherein said defect verification assembly is operative to avoid verifying at least some marked candidate defects, and wherein said candidate defect marker is operative in further response to a verification time interval parameter.

14. A method for manufacturing electrical circuits, comprising:
- forming portion of an electrical circuit pattern on an electrical circuit substrate;
- automatically inspecting an electrical circuit pattern to identify candidate defects;
- supplying a plurality of like electrical circuit patterns to a defect verification assembly after automatically identifying candidate defects;
- verifying selected candidate defects as being one of: an actual defect, and a false defect;
- marking a candidate defect in response to a recurrence of a given candidate defect at substantially corresponding locations on at least two electrical circuit patterns; and
- applying candidate defect markings from previously verified electrical circuit patterns to a currently verified electrical circuit pattern, and wherein said verifying comprises avoiding verifying at least some marked candidate defects.

15. The method claimed in claim 14, wherein said false defect comprises one or more of a misdetection and a non-defect.

16. The method claimed in claim 14, further comprising repairing a repairable actual defect.

17. The method claimed in claim 14, further comprising discarding an electrical circuit pattern comprising a non-repairable actual defect.

18. The method claimed in claim 14, wherein said marking is further in response to a defect type parameter.

19. The method claimed in claim 18, wherein said supplying operation is further in response to a defect type parameter.

20. A method for manufacturing electrical circuits, comprising:
- forming portion of an electrical circuit pattern on an electrical circuit substrate;
- automatically inspecting an electrical circuit pattern to identify candidate defects;
- supplying a plurality of like electrical circuit patterns to a defect verification assembly after automatically identifying candidate defects;
- verifying selected candidate defects as being one of: an actual defect, and a false defect;
- marking a candidate defect in response to a recurrence of a given candidate defect at substantially corresponding locations on at least two electrical circuit patterns; and
- applying candidate defect markings from previously verified electrical circuit patterns to a currently verified electrical circuit pattern, wherein said verifying comprises avoiding verifying at least some marked candidate defects, and wherein said marking is further in response to a verification time interval parameter.

21. The method claimed in claim 20, wherein said verification time interval parameter comprises verifying a candidate defect in less than said predetermined time interval.

22. A method for verifying defects in electrical circuit patterns, comprising:
- supplying a plurality of like electrical circuit patterns to a defect verification assembly after identification of candidate defects at an automated inspection assembly;
- verifying selected candidate defects as being one of: an actual defect, and a false defect; and
- marking a candidate defect in response to a recurrence of a given candidate defect at substantially corresponding locations on at least two electrical circuit patterns,
- wherein said marking is further in response to a verification time interval parameter.

23. A defect verification system for verifying defects in electrical circuit patterns, comprising:
- a defect verification assembly receiving a plurality of like electrical circuit patterns after identification of candidate defects at an automated inspection assembly, whereat selected candidate defects are verified as being one of: an actual defect, and a false defect; and
- a candidate defect marker marking candidate defects at least partially in response to a recurrence of a given candidate defect at substantially corresponding locations on at least two electrical circuit patterns,
- wherein said candidate defect marker is operative in further response to a verification time interval parameter.

24. A method for manufacturing electrical circuits, comprising:
- forming portion of an electrical circuit pattern on an electrical circuit substrate;
- automatically inspecting an electrical circuit pattern to identify candidate defects;
- supplying a plurality of like electrical circuit patterns to a defect verification assembly after automatically identifying candidate defects;
- verifying selected candidate defects as being one of: an actual defect, and a false defect; and
- marking a candidate defect in response to a recurrence of a given candidate defect at substantially corresponding locations on at least two electrical circuit patterns,
- wherein said marking is further in response to a verification time interval parameter.

* * * * *